United States Patent
Ripley (10) Patent No.: US 10,079,135 B1
(45) Date of Patent: Sep. 18, 2018

(54) GAS-SEALED STUB TUNER FOR MICROWAVE SYSTEMS

(71) Applicant: Consolidated Nuclear Security, LLC, Oak Ridge, TN (US)

(72) Inventor: Edward B. Ripley, Knoxville, TN (US)

(73) Assignee: Consolidated Nuclear Security, LLC, Oak Ridge, TN (US)

(*) Notice: Subject to any disclaimer, the term of this patent is extended or adjusted under 35 U.S.C. 154(b) by 0 days.

(21) Appl. No.: 15/955,951

(22) Filed: Apr. 18, 2018

(51) Int. Cl.
*H01J 37/32* (2006.01)
*H01P 5/04* (2006.01)

(52) U.S. Cl.
CPC .......... *H01J 37/32192* (2013.01); *H01P 5/04* (2013.01)

(58) Field of Classification Search
CPC ........... H01J 37/32192; H01J 37/32211; H01J 37/32229; H01J 37/32238; H01J 37/32256; H01J 37/32266; H01J 37/32825; H05B 6/705; H05B 6/707; H05H 1/24; H05H 1/2406; C23C 16/045; C23C 16/511
See application file for complete search history.

(56) References Cited

U.S. PATENT DOCUMENTS

| | | | |
|---|---|---|---|
| 2,968,776 A | 1/1961 | Book | |
| 4,140,985 A | 2/1979 | Rozenfeld | |
| 5,111,111 A | 5/1992 | Stevens et al. | |
| 5,164,688 A | 11/1992 | Larson | |
| 5,508,227 A | 4/1996 | Chan et al. | |
| 5,621,331 A | 4/1997 | Smith et al. | |
| 7,682,482 B2 * | 3/2010 | Yoshida | H01J 37/32192 118/723 MW |
| 8,747,962 B2 * | 6/2014 | Bicker | C23C 16/006 118/723 R |

FOREIGN PATENT DOCUMENTS

WO 2004008809 A1 1/2004

* cited by examiner

*Primary Examiner* — Haissa Philogene
(74) *Attorney, Agent, or Firm* — Luedeka Neely Group, P.C.; Michael J. Renner, Esq.

(57) ABSTRACT

A stub tuner apparatus includes a body portion having a first end and a second end and defining an internal space configured to carry electromagnetic energy. A gas-sealed pocket extends from the body portion such that, when the body portion forms a portion of a gas-sealed environment, the stub tuner apparatus is gas sealed. A stub is disposed in the gas-sealed pocket and the apparatus includes a linear translation means for moving the stub at least partially out from and into the pocket and at least partially into and out from the internal space without breaching the gas-sealed environment of the stub tuner apparatus.

22 Claims, 7 Drawing Sheets

GAS-SEALED STUB TUNER FOR MICROWAVE SYSTEMS

GOVERNMENT RIGHTS

The U.S. Government has rights to this invention pursuant to contract number DE-NA0001942 between the U.S. Department of Energy and Consolidated Nuclear Security, LLC.

FIELD

The present disclosure relates to microwave systems. In particular, the present disclosure relates to a gas-sealed stub tuner for microwave systems.

BACKGROUND

Microwave systems are used in a variety of fabrication processes. Often, microwaves are generated by a microwave source and are then delivered to an intended load. In the case of microwave casting, for example, the microwave power may be used to melt metals held in a crucible. To improve the efficiency of this process, the amount of power delivered to the intended load is maximized so that more of the microwave power is transferred to the load instead of being lost as heat, reflected back to the source, etc. One method for maximizing power delivery and reducing loss of microwave power is impedance matching. The end goal of impedance matching is to match the impedance of the intended load to the impedance of the source of power by placing an impedance-matching device between the source and the load.

A stub tuner is one type of impedance matching device. A stub tuner typically consists of one or more variable length stubs of transmission line or waveguide that are located between the source and the load. The operative length of each stub is increased or decreased in order to modify the impedance. In the case of a microwave system, stubs are positioned in "pockets" adjacent the waveguide between the microwave source and the intended load. The stubs are inserted into and extracted out from the waveguide, thereby varying their operative length, to adjust the impedance. One historic method for achieving this insertion and extraction is by attaching a threaded rod to the end of the stub and then inserting and retracting the stub by turning the threaded rod.

Some microwave applications require a high-vacuum environment to operate most effectively. For example, a high-vacuum environment is required for semi-conductor fabrication. In certain other cases, there is a need for a specific chamber environment in the microwave processing chamber, such as an inert environment. This requires creating a vacuum in the chamber and then backfilling the chamber with the desired chamber gas. Historically, the use of a stub tuner in connection with high vacuum or highly pressurized microwave applications has been difficult. A primary reason for this difficulty is that the structure of existing stub tuners does not allow for a vacuum or pressurized environment (hereinafter, collectively or interchangeably referred to as "pressurized" environments, unless specifically noted) to be created if the stub tuner is located within that environment. As mentioned above, threaded rods have been used to adjust the positioning of stubs in stub tuners. Such method and other existing methods for adjusting the stub length require some physical perforation of the pocket to connect the stub located within the pocket and the adjustment means located outside of the pocket for adjusting the amount of stub length inserted into the waveguide (the operative length).

Various methods have been used to allow the use of a stub tuner in a highly pressurized environment. One such method requires separating the microwave system into a pressurized section and a non-pressurized section separated by a gas-sealed barrier, such as a quartz window, that permits the transmission of microwaves through the barrier. The intended load that requires the pressurized environment is located in the pressurized section whereas the stub tuner is located on the other side of the gas-sealed barrier in the non-pressurized section. A common problem with this type of design, however, is that the gas-sealed barrier can become contaminated so that it begins coupling with the microwaves or otherwise interferes with the microwaves that reach the intended load after the microwaves have been tuned. Also, the gas-sealed barrier itself has an impedance that must be accounted for after the microwaves have been tuned. Many times, wave matching features and/or filters must be incorporated into the design of the microwave system to reduce these interferences and to account for the impedance of the gas-sealed barrier. Unfortunately, these added structures adversely affect the efficiency of the system because the best tuning for the window may not be the same as the best tuning for the pressured cavity. In other words, although the stub tuner may be optimized so that the maximum amount of power is transmitted through the gas-sealed barrier, that tuning may not be ideal for transmitting the maximum amount of power to the load in the processing chamber.

Accordingly, what is needed is a stub tuner configured to be in fluid communication with a microwave processing chamber so that tuned microwaves are directed to the chamber and load without being contaminated or obstructed.

SUMMARY

According to one embodiment of the disclosure, a stub tuner apparatus includes a body portion having a first end and a second end and defining an internal space configured to carry electromagnetic energy. The body portion is operable to form a portion of a gas-sealed environment. The stub tuner apparatus further includes a gas-sealed pocket extending from the body portion such that, when the body portion forms the portion of the gas-sealed environment, the stub tuner apparatus is gas sealed. A stub is disposed in the gas-sealed pocket and the apparatus includes linear translation means for moving the stub at least partially out from and into the pocket and at least partially into and out from the internal space without breaching the gas-sealed environment of the stub tuner apparatus.

According to certain embodiments, the first end of the body portion includes a gas sealing member and the second end includes a downstream opening configured for connecting to a processing chamber.

According to certain embodiments, the gas-sealed pocket includes one or more retractable walls that are movable between a collapsed position wherein the stub disposed in the gas-sealed pocket is moved towards the internal space of the body portion and an extended position wherein the stub disposed in the gas-sealed pocket is moved away from the internal space. According to this embodiment, the linear translation means includes an actuator disposed outside the gas-sealed pocket for causing movement of the one or more retractable walls.

According to certain embodiments, the linear translation means includes a first magnetic member disposed inside the pocket and coupled to the stub such that the stub is movable with the first magnetic member and a second magnetic member disposed outside the pocket and configured to magnetically couple with the first magnetic member such that the first magnetic member is movable with the second magnetic member. In other embodiments, a plurality of stepping coils are disposed exterior to and along the length of the pocket and wherein the stub is moved along the length of the pocket by sequentially activating and deactivating the stepping coils in the direction that the first magnetic member and stub is to be moved. In certain embodiments, the plurality of stepping coils are configured to radially extend around the exterior of the pocket such that the stub rotates as it is moved along the length of the pocket.

According to certain embodiments, the pocket is dimensioned and configured such that the stub falls out of the internal space and into the pocket when the linear translation means is deactivated. According to some embodiments, the apparatus further includes a channel dimensioned and configured to allow gas pressure in the pocket below a distal surface of the stub to be equalized with gas pressure located above a proximal surface of the stub. According to some embodiments, the apparatus further includes a plurality of pockets extending from the body portion and at least one stub disposed in each of the plurality of pockets.

According to another embodiment of the disclosure, a microwave processing system includes a microwave source for generating microwaves, a processing chamber in communication with the microwave source, and a stub tuner disposed between the microwave source and the processing chamber. The processing chamber and the stub tuner form a gas-sealed environment. The stub tuner includes a body portion defining an internal space, a gas-sealed pocket extending from the body portion, a stub disposed in the gas-sealed pocket, and linear translation means for moving the stub at least partially out from and into the pocket and at least partially into and out from the internal space without breaching the gas-sealed environment.

According to certain embodiments, the microwave processing system further includes a waveguide for guiding the microwaves from the microwave source to the processing chamber and a gas-sealing member separating the wave guide into a first portion and a second portion. The gas-sealing member is configured to permit microwaves to travel from the first portion to the second portion of the wave guide and to prevent gas from traveling between the first and second portion of the wave guide. According to this embodiment, the stub tuner is disposed downstream from the gas-sealing member. In some embodiments, the stub tuner forms the second portion of the wave guide.

According to certain embodiments, the microwave processing system further includes a gas supply for selectively supplying gas to the gas-sealed environment and a gas outlet for selectively exhausting gas from the gas-sealed environment, wherein one of a pressurized and vacuum atmosphere is formed within the gas-sealed environment by selectively supplying or exhausting gas from the gas-sealed environment.

According to certain embodiments, the microwave processing system further includes a wave matching feature disposed within the first portion of the wave guide for matching the impedance of the microwaves generated by the microwave source to the impedance of the gas-sealing member.

According to certain embodiments, the gas-sealed pocket of the stub tuner includes one or more retractable walls that are movable between a collapsed position wherein the stub disposed in the gas-sealed pocket is moved towards the internal space of the body portion and an extended position wherein the stub disposed in the gas-sealed pocket is moved away from the internal space. According to this embodiment, the linear translation means includes an actuator disposed outside the gas-sealed pocket for causing movement of the one or more retractable walls.

According to certain embodiments, the linear translation means includes a first magnetic member disposed inside the pocket and coupled to the stub such that the stub is movable with the first magnetic member and a second magnetic member disposed outside the pocket and configured to magnetically couple with the first magnetic member such that the first magnetic member is movable with the second magnetic member. In other embodiments, a plurality of stepping coils are disposed exterior to and along the length of the pocket and the stub is moved along the length of the pocket by sequentially activating and deactivating the stepping coils in the direction that the first magnetic member and stub is to be moved. In certain embodiments, the plurality of stepping coils are configured to radially extend around the exterior of the pocket such that the stub rotates as it is moved along the length of the pocket.

According to certain embodiments, the pocket is dimensioned and configured such that the stub falls out of the internal space and into the pocket when the linear translation means is deactivated.

According to certain embodiments, the microwave processing system further includes a channel dimensioned and configured to allow gas pressure in the pocket below a distal surface of the stub to be equalized with gas pressure located above a proximal surface of the stub.

According to yet another embodiment of the disclosure, a method of tuning a microwave system includes providing a microwave source for generating microwaves and a processing chamber for housing an intended load; providing a waveguide for guiding microwaves from the microwave source to the intended load in the processing chamber; positioning a stub tuner between the microwave source and the processing chamber, the processing chamber and the stub tuner forming a gas-sealed environment, the stub tuner including a body portion defining an internal space, a gas-sealed pocket extending from the body portion, and a stub linearly translatable within the gas-sealed pocket; generating microwaves using the microwave source and causing the microwaves to travel through the waveguide and internal space of the stub tuner to the processing chamber; and moving the stub at least partially out from and into the gas-sealed pocket and at least partially into and out from the internal space of the body portion of the stub tuner without breaching the gas-sealed environment to modify an impedance of the intended load.

According to certain embodiments, the method further includes providing a wave guide for guiding the microwaves from the microwave source to the processing chamber and a gas-sealing member separating the wave guide into a first portion and a second portion. According to this embodiment, the gas-sealing member is configured to permit microwaves to travel from the first portion to the second portion of the wave guide and to prevent gas from traveling between the first and second portion of the wave guide. The stub tuner is disposed downstream from the gas-sealing member.

According to certain embodiments, the stub tuner forms the second portion of the wave guide.

BRIEF DESCRIPTION OF THE DRAWINGS

Further advantages of the disclosure are apparent by reference to the detailed description when considered in conjunction with the figures, which are not to scale so as to more clearly show the details, wherein the reference numbers indicate like elements throughout the several views, and wherein.

DETAILED DESCRIPTION

As the term is used herein, "gas-sealed" means substantially free of gas leaks to be suitable for use in connection with providing either a vacuum tight or pressurized volume of space. In more particular respect to the pockets that house the stubs, the term "gas sealed" means the pockets have no perforations or openings other than the pocket openings into the gas-sealed waveguide body that permit insertion and extraction of the stubs into and out from the waveguide body. As used herein, unless specified otherwise, the term "magnet" is used generally and may refer to any kind of component having or capable of having a magnetic field, including a permanent magnet or an electromagnet.

Figure 1:
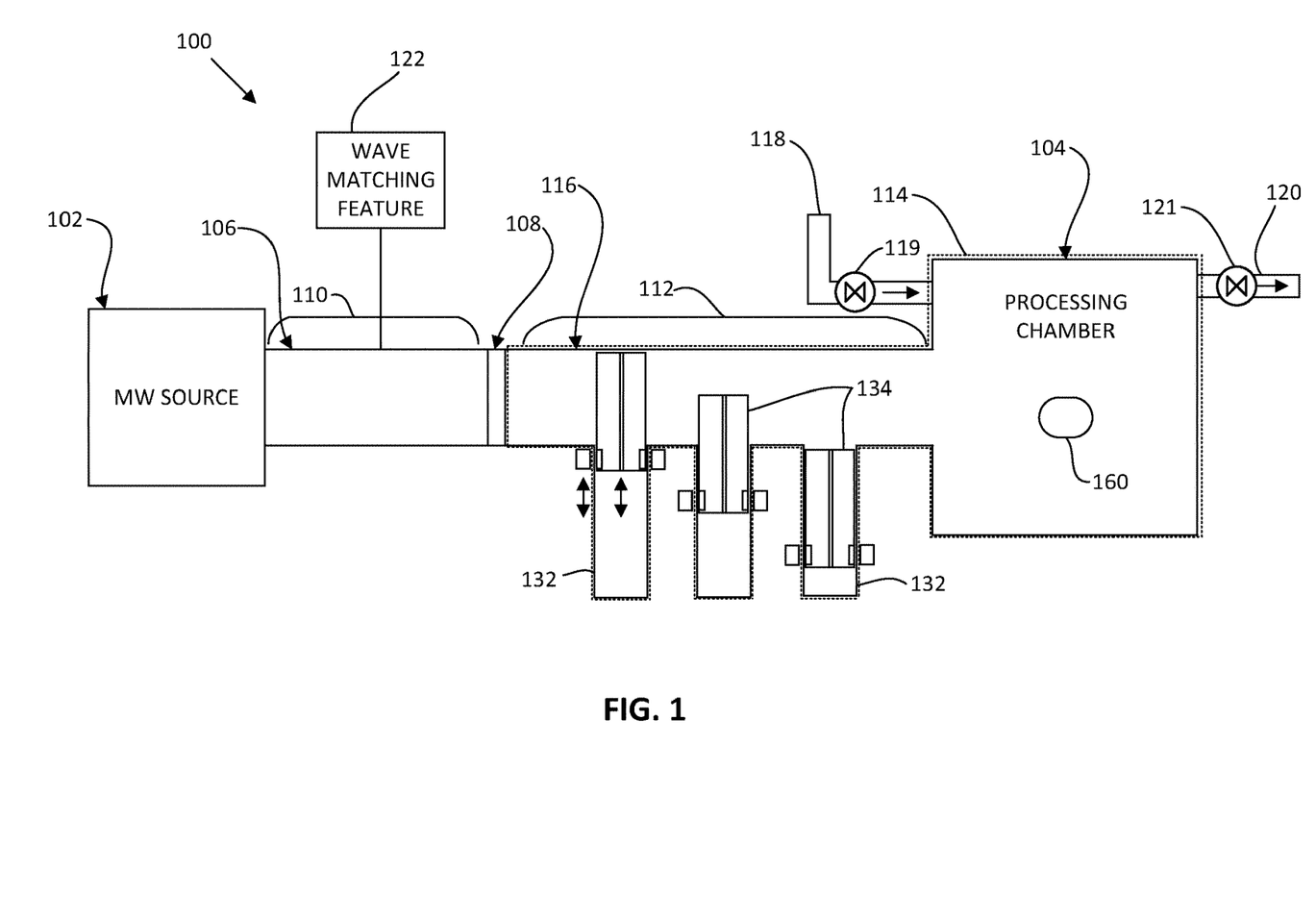
FIG. 1 is a schematic diagram of a microwave system having a stub tuner forming a portion of a gas-sealed waveguide according to an embodiment of the present disclosure.

With reference now to FIG. 1, there is provided a microwave processing system 100 according to an embodiment of the present disclosure. On the generating end of the system 100 is a microwave (MW) source 102 that generates microwaves. At the opposite end of the system 100 is a processing chamber 104 where the microwaves are received and act upon an intended load 160 located within the processing chamber. A waveguide 106 directs microwaves from the MW source 102 to the processing chamber 104. For purposes of the present disclosure, the term "downstream" refers to the direction from the microwave source 102 towards the processing chamber 104 while the term "upstream" refers to the direction from the processing chamber 104 towards the microwave source 102.

In preferred embodiments, a gas-sealing member 108, such as an optical quartz window, is located along the length of the waveguide 106 and separates the waveguide into a first portion 110 and a second portion 112. The gas-sealing member 108 permits microwaves to travel from the first portion 110 to the second portion 112 of the waveguide 106. However, the gas sealing member 108 is configured to provide a substantially gas-tight seal between the first portion 110 and the second portion 112 of waveguide 106 to prevent gas from traveling between said first and second portions. The second portion 112 of waveguide 106 is preferably in direct fluid communication with the processing chamber 104.

An inlet 118 configured with shut-off valve 119 is provided for supplying gas to the processing chamber 104, and optionally, an outlet 120 configured with shut-off valve 121 is provided for exhausting gas from the processing chamber 104. It may be appreciated that in some embodiments, a single vent with valve may serve as both gas inlet and gas outlet. When shut-off valves 119 and 121 are completely closed, the volume defined by the second portion 112 of waveguide 106, the pockets 132 that house the stubs 134, the processing chamber 104, and portions of the inlet 118 and outlet 120 located between their respective valves (119, 121) and the processing chamber, create a gas-sealed environment 114. By adjusting valves 119 and 121 to control the amount of gas supplied via inlet 118 to processing chamber 104, or exhausted via outlet 120 from said processing chamber, the gas-sealed environment 114 may be maintained at positive, negative, or ambient pressure.

The system 100 further includes a stub tuner 116 that forms a portion of the gas-sealed environment 114 in the second portion 112 of the waveguide 106 (i.e., the stub tuner is disposed downstream from the gas-sealing member 108). Microwaves originating from the MW source 102 pass through the first portion 110 of the waveguide 106 and then through gas-sealing member 108. A wave matching feature 122 known to the art may be used to match the impedance of gas-sealing member 108 to the microwave impedance in order to minimize power loss as the microwaves pass through gas-sealing member 108. The microwaves pass through the gas-sealing member 108 and then into the second portion 112 of waveguide 106 where the stub tuner pockets 132 that house stubs 134 are located. The stub tuner 116 is then used to match the impedance of the processing chamber 104 to the microwaves. The microwaves then pass directly into the processing chamber 104 to the intended load, preferably without passing through any intervening structures that might degrade efficiency. Thus, the system 100 described above enables the use of a stub tuner 116 in a pressurized environment (positive or negative pressure) to provide tuning that is ideal for the processing chamber 104 and that is not impacted by intervening structures located between the stub tuner and the intended load.

Figure 2:
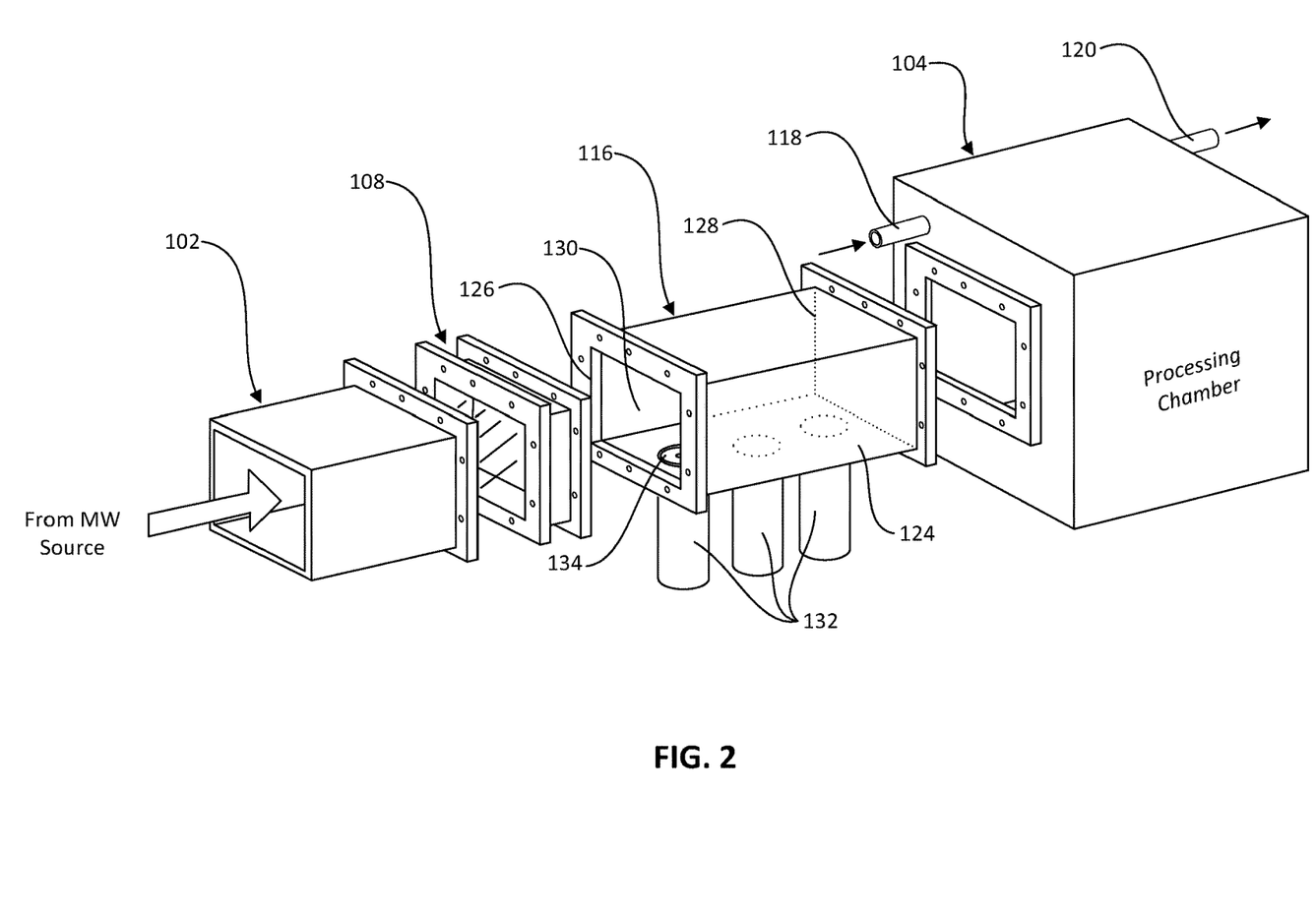
FIG. 2 is an exploded view of a stub tuner forming the gas-sealed portion of a waveguide according to an embodiment of the present disclosure.

With reference to FIG. 2, the stub tuner 116 includes a body portion 124 with a first end 126 and a second end 128 and defining an internal space 130. As shown, according to certain embodiments, body portion 124 forms the second portion 112 of waveguide 106 where the first end 124 is an upstream opening and the second end 128 is a downstream opening. According to this embodiment, the first end 126 is configured to be connected to the gas-sealing member 108 and the second end 128 is configured to be connected to the processing chamber 104. According to an alternate embodiment, the first end 126 of body portion 124 includes the gas-sealing member (i.e., the stub tuner 116 is provided with a gas-sealing member 108 already secured to the upstream opening for easy connection with an upstream waveguide 106).

In operation, electromagnetic (EM) energy, such as microwaves, passes through the first end 126, the internal space 130, and out through the second end 128 of body portion 124. At least one pocket 132 extends outward at any angle from the body portion 124. Preferably, three or four pockets 132 are included, each in fluid communication with internal space 130. A stub 134 is located inside each pocket 132. In some embodiments, more than one stub may be located inside a pocket. The stub 134 is configured to move out of the pocket and into the internal space 130 of the body portion 124 and vice versa. As detailed below, stub tuner 116 includes a linear translation means for linearly translating the stub 134 located in the at least one pocket 132 into the internal space 130. In the embodiment shown in FIG. 2, three separate pockets 132, each with a stub 134 disposed therein, are provided with the stub tuner 116. By inserting or extracting one or more of the stubs 134 into or out from the internal space 130, the impedance of the intended load may be matched to the impedance of the microwaves in order to maximize the amount of power transferred to the load.

An important feature of stub tuner 116 is that it forms a portion of the gas-sealed environment 114 (FIG. 1) as previously described herein. In other words, each of the pockets 132 are completely sealed and have no openings or penetrations where gas could escape or enter other than the opening into the body portion 124. To accomplish this feature, the means used to insert and extract the stub 134 into and out from the internal space 130 is configured so that the means does not penetrate or otherwise breach the gas-sealed environment 114 from outside the gas-sealed environment.

Figure 3:
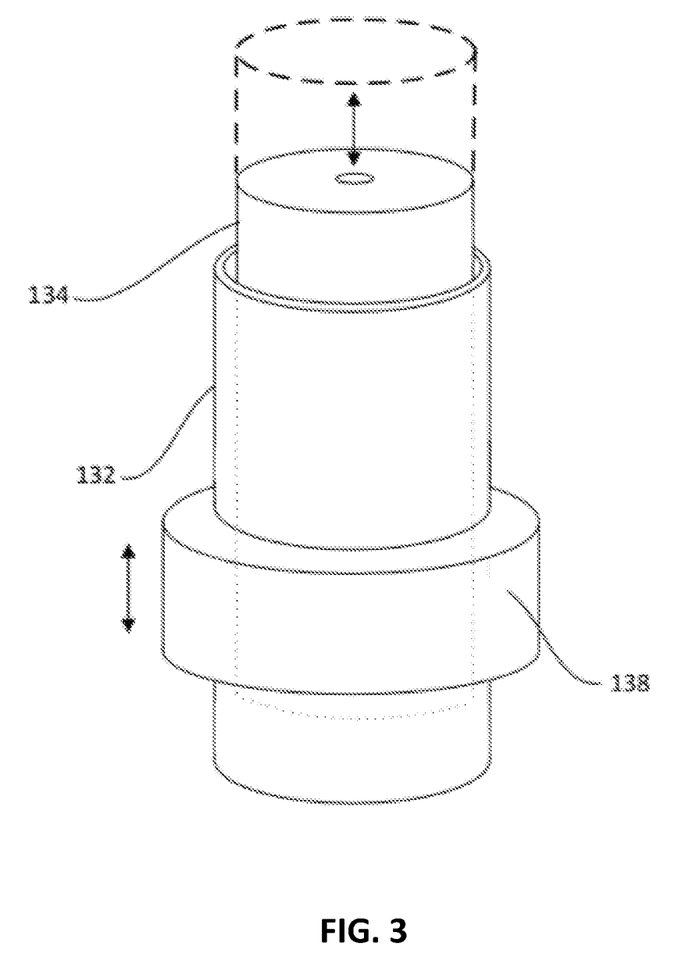
FIG. 3 is a perspective view of a pocket, stub, and magnetic member for linearly translating the stub within the pocket according to an embodiment of the present disclosure.
Figure 6:
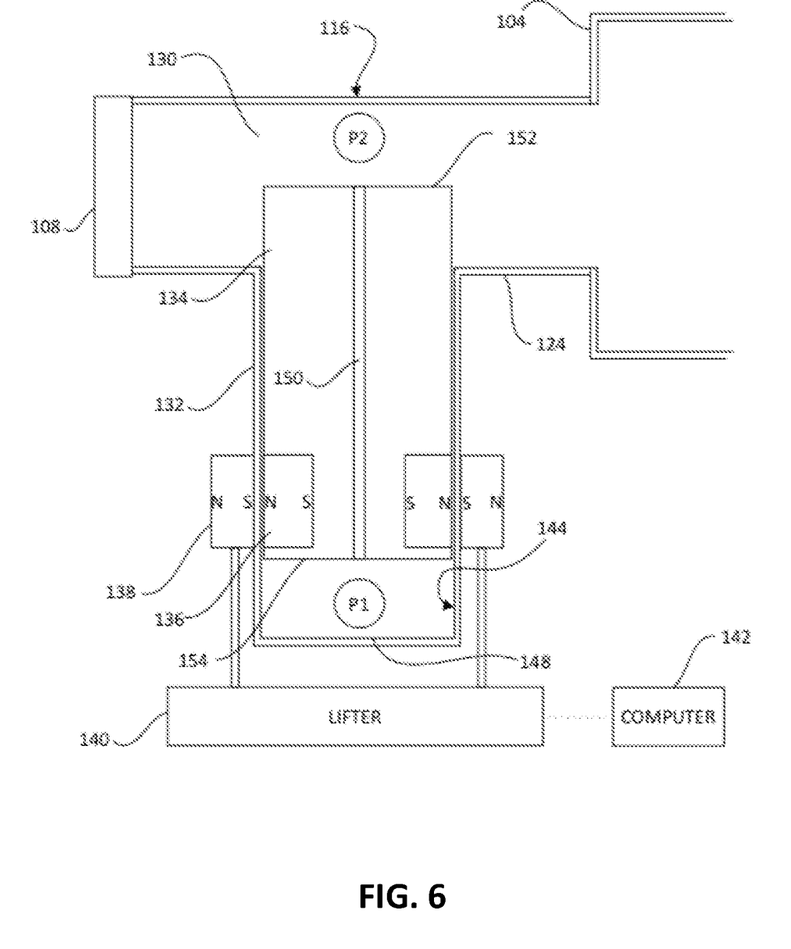
FIG. 6 is a cross-sectional view of a gas-sealed portion of a microwave system including a stub tuner having a gas-sealed stub pocket according to an embodiment of the present disclosure.

One example of the linear translation means for inserting and extracting the stub 134 located within the pocket 132 is through the use of magnets. For example, as shown in FIGS. 3 and 6, the linear translation means includes a first magnetic member 136 (FIG. 4) located inside the pocket 132 that is captured in or mounted to, and is movable with, the stub 134. In this particular case, the first magnetic member 136 positioned within pocket 132 is made up of one or more permanent magnets that are captured in or mounted to the stub 134. A second magnetic member 138 is positioned outside the pocket 132 and is configured to magnetically couple with the first magnetic member 136. In this particular case, the second magnetic member 138 is a doughnut-shaped permanent magnet that surrounds the pocket 132. In place of permanent magnets, other types of magnets, such as electromagnets may be used. The first and second magnetic members 136, 138 are sized and their magnetic poles ("N" for north and "S" for south) are arranged so that they magnetically couple to each other through the walls of pocket 132. The pocket 132 may be constructed, for example, using thin-walled aluminum. The magnetic strength of the magnets 136, 138 and the wall thickness of the pocket 132 are sized such that the magnets can magnetically couple together. Once magnetically coupled together, the first magnetic member 136 moves as the second magnetic member 138 moves. Since the first magnetic member 136 is captured by and is movable with the stub 134, the stub also moves as the second magnetic member 138 moves.

In certain embodiments, the pocket 132 is dimensioned and configured so that the stub 134 falls entirely out of internal space 130 in the event that linear translation means is deactivated. For example, with reference to the embodiment of FIGS. 3 and 6, the pocket 132 is dimensioned and configured so that the stub 134 falls out of the internal space 130 when the first and second magnetic members 136, 138 are deactivated by becoming magnetically de-coupled. More specifically, in preferred embodiments, the pocket 132 extends downwardly from the body portion 124 of the stub tuner 116 at a sufficient downward angle such that, if the second magnetic member 138 is magnetically de-coupled from the first magnetic member 136, the stub 134 falls out of the internal space 130 and into the pocket 132 due to gravity. This feature may be useful, for example, during a power outage, where an electromagnet is used for the second magnetic member 138. In that case, losing power would cause the electromagnet to become magnetically de-coupled from the first magnet 136. In that scenario, it is often preferred to have the stub 134 removed from the internal space 130. In other embodiments, it may advantageous to have pockets 132 extending outwards from the body portion 124 at more than one angle. For example, pockets 132 may extend from both the top and the bottom of body portion 124, from opposite horizontal sides of body portion 124, or from any other orientation about body portion 124.

To function effectively, stubs 134 are electrically coupled with the pockets 132 or body portion 124 to ground the stub to the body portion to prevent the potential for electrical arcing. In some embodiments, the first magnetic member 136 is designed to electrically couple the stub 134 with the body portion 124. In other embodiments, a stub or the first magnetic member 136, or both, is in direct contact with an internal wall surface 144 of the pocket and that contact provides the necessary electrical contact to ground the stub to the body portion. However, in still other embodiments, at least one of the stub and the first magnetic member 136 are located immediately adjacent the internal wall surface 144 of the pocket 132 and a conductive armature or contactor may be utilized to provide the necessary electrical contact. This may be useful, for example, to limit friction between the stub 134 and the pocket 132 while still grounding the stub to the body portion 124. The pocket 132 may be designed to act as an electrical conductor between the stub 134 and the tuner body portion 124, provided the pocket 132 itself is electrically conductive (or is conductively coated).

Figure 4:
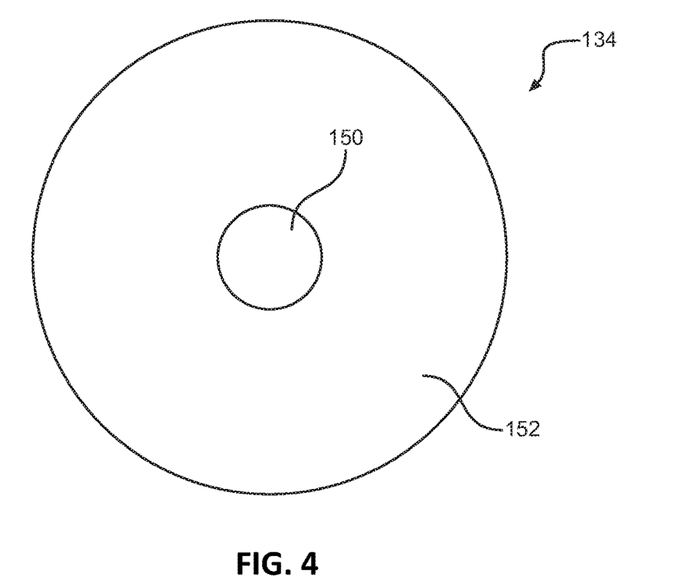
FIG. 4 is a top view of the stub depicted in FIG. 3.
Figure 5:
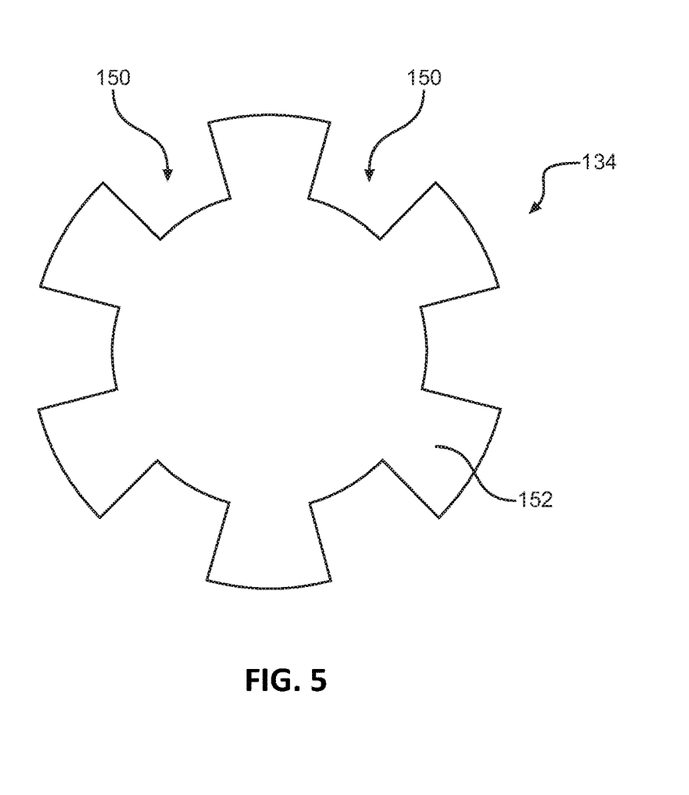
FIG. 5 is a top view of a stub according to an alternate embodiment of the present disclosure.

Since, as described above, stub 134 almost contacts or, in some cases, is in contact with the internal wall surface 144, the space between a distal surface 154 of the stub 134 and the distal surface 148 of the pocket 132 is substantially gas tight. As a result, moving the stub 134 parallel to the internal wall surface 144 in a non-vacuum environment would be more difficult unless the pressure P1 below the stub proximate distal surface 148 is equalized with the pressure P2 above the stub in internal space 130. For this reason, an optional pressure equalization feature is provided for equalizing pressure P1 with pressure P2. For example, referring to FIG. 6, one or more channels 150 extend through the stub 134 from a proximal surface 152 of the stub to the distal surface 154 of the stub. As the stub 134 is linearly translated, gas flows through the one or more channels 150 and the pressures P1, P2 are equalized. Referring to FIGS. 4 and 5, it should be understood that various configurations and locations of the one or more channels could be utilized. In this regard, FIG. 4 depicts a single channel 150 extending lengthwise through the center of the stub 134 (though the channel being in the center is not critical). On the other hand, FIG. 5 depicts multiple channels 150 disposed along the outer circumference of the stub 134. In yet another potential embodiment, one or more gas-sealed channels 150 could be formed exterior to the stub 134 for fluidly connecting internal space 130 to the space between the distal surface 154 of the stub 134 and the distal surface 148 of the pocket 132.

Once the first and second magnetic members 136, 138 are magnetically coupled together, a lifter 140 may be used to linearly displace the second magnetic member 138. Examples of a suitable lifter 140 include an actuator or threaded rod mounted to the second magnetic member 138 that moves upward/forward and downward/backward to linearly displace the second magnetic member. The lifter 140 may be selectively controlled by a computer 142. In other cases, the lifter 140 is manually controlled.

Figure 7:
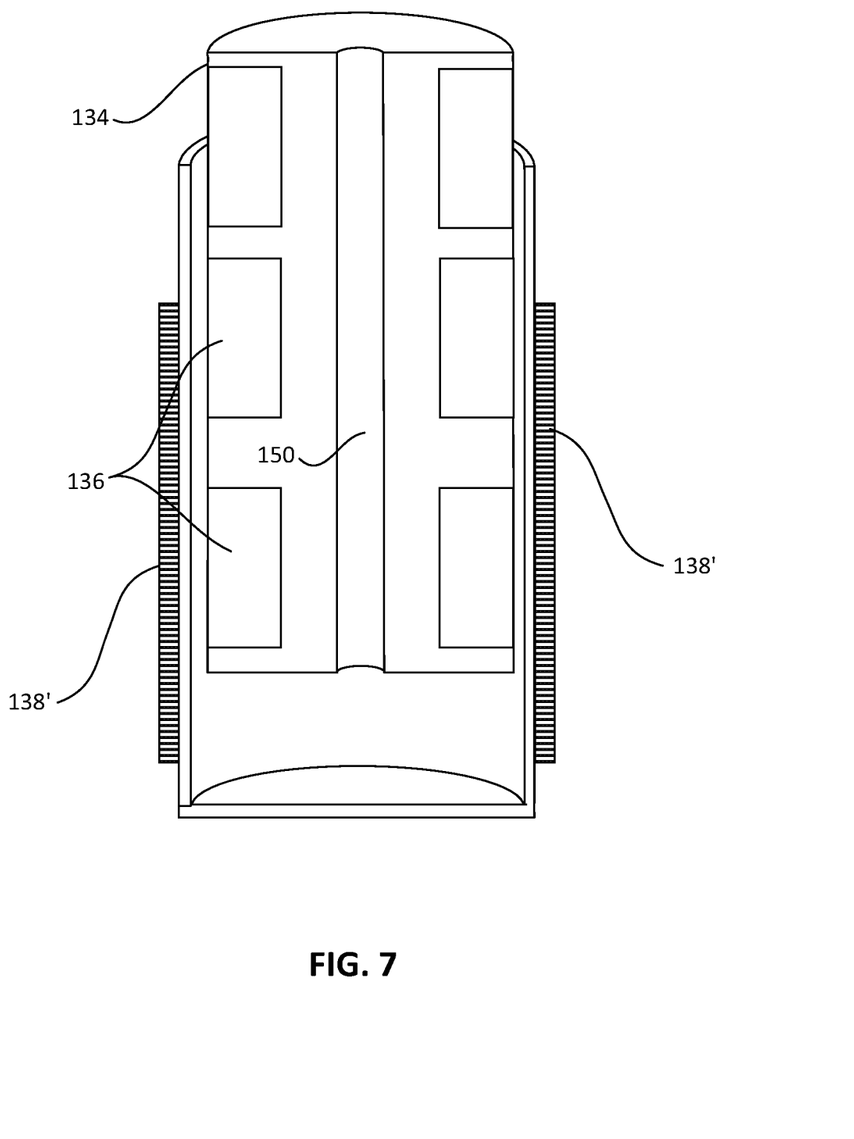
FIG. 7 is a front view of a pocket, stub, and lifting means for linearly translating the stub within the pocket according to an embodiment of the present disclosure.

A lifter 140 is not required in some cases because the second magnetic member 138 can remain stationary even while the first magnetic member 136 and the stub 134 are moved. For example, as shown in FIG. 7, the second magnetic member is a plurality of stepping coils 138' disposed exterior to the pocket 132 along a suitable length of the pocket 132. In certain embodiments, the stepping coils 138' extend linearly along the length of the pocket 132 as shown in FIG. 7. In alternate embodiments, the stepping coils 138' are configured to extend radially around the exterior of the pocket 132, and the stub 134 rotates as it linearly translates into and out from the internal space 130. In general, the stepping coils 138' create a traveling current vector that travels along the desired length of the pocket to create an electromagnetic force that couples with the first magnetic member 136. An advantage of a stepping coil 138' is that it provides for high-precision position control and the stubs 134 can be positioned at a desired location very quickly, accurately, and repeatedly.

Figure 8:
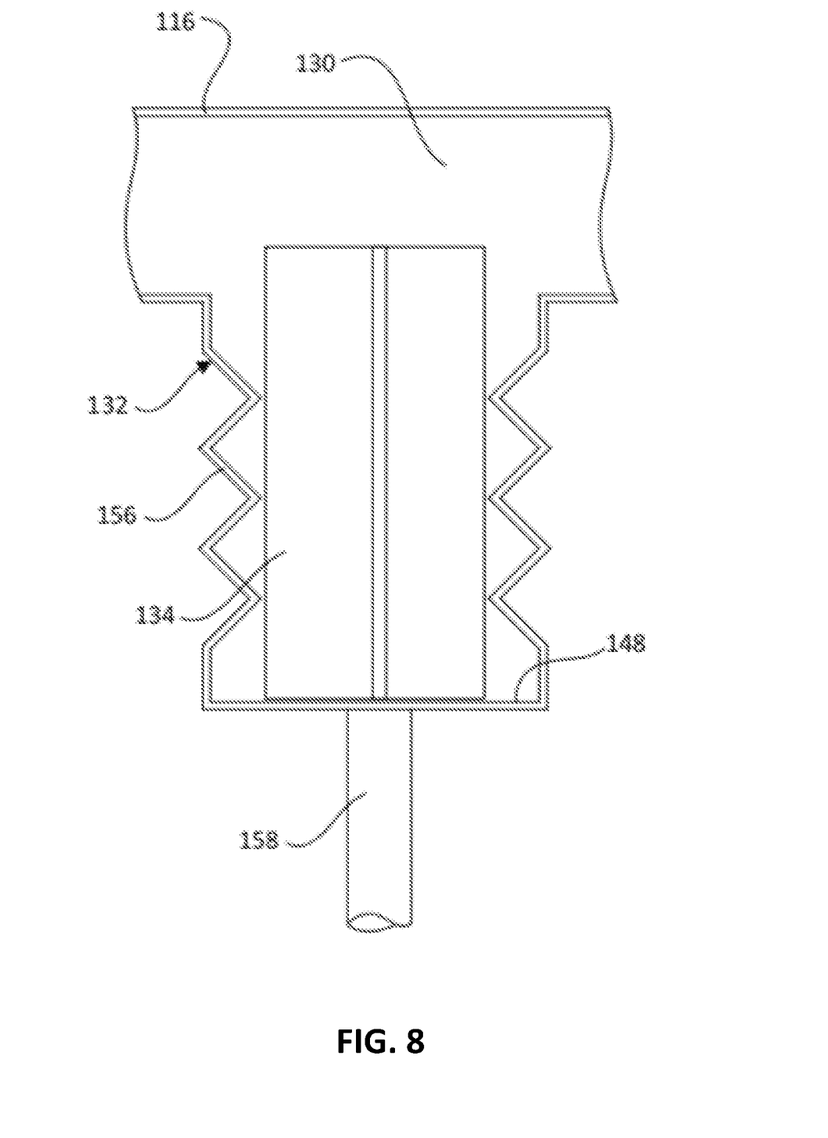
FIG. 8 is a cross-sectional view of a linearly translatable pocket for a stub tuner having a retractable wall according to an embodiment of the present disclosure.

Certain other embodiments employ a lifting mechanism wherein at least a portion of the pocket 132 itself is linearly translatable, and translation of the pocket 132 allows the stub 134 to be inserted into or extracted from internal space 130. For example, as shown in FIG. 8, the pocket 132 includes one or more retractable walls 156 that enable the pocket to be moved between a collapsed position wherein the stub 134 disposed in the pocket 132 is moved towards the internal space 130 and an extended position wherein the stub 134 is moved away from the internal space 130. In other words, the stub 134 is mounted inside sealed pocket 132 so that it moves when the pocket 132 moves. The pocket 132 may be moved by an actuator 158 mounted external to sealed pocket 132.

The retractable walls may take various forms such as bellows, telescoping walls, foldable/flexible walls, etc. Further, in the example shown in FIG. 8, at least a portion of the wall 156 is linearly translatable. However, in other embodiments, at least a portion of the distal surface 148 is linearly translatable and the walls 156 may also be linearly translatable or may be rigid. For example, distal surface 148 may be formed using a flexible membrane, by a telescoping material, or other configuration in conjunction with linearly translatable or rigid walls 156.

It may be appreciated that using a pocket 132 with retractable walls, such as the one shown in FIG. 8, may be troublesome in a vacuum or pressurized environment without some modification. In a vacuum or other negative pressure environment, for example, the vacuum or negative pressure could cause the pocket 132 and stub 134 within to be pulled inwards to a compressed state. Conversely, in a positive pressure environment, the pocket 132 may be forced away from body portion 124 into an undesirable tuning position. Therefore, actuator 158 may be configured to provide the desired force on pocket 132 to maintain the desired depth of insertion of stub 134 into internal space 130 in vacuum or various pressure environments.

In still other embodiments, a lifting means may be placed entirely within the gas-sealed environment 114. For example, the lifting means may be a remotely operated motor. The motor may be powered by batteries. In some embodiments, the batteries may be wirelessly charged, such as by using inductive charging, to avoid the need to break the gas seal. In some configurations, the motor would drive a threaded rod located entirely within gas-sealed environment 114 wherein such threaded rod linearly translates the stub 134 (which in this embodiment would have a threaded interior hole configured to engage the threaded rod) between internal space 130 and sealed pocket 132 as the threaded rod rotates. Typically, the motor and threaded rod would be located within pocket 132 and the threaded rod would be attached proximate the distal surface 148. In yet other configurations, the threaded rod may be attached to the interior wall of body portion 124 opposite from the opening of pocket 132 or other advantageous location.

According to other embodiments, the threaded rod located entirely within gas-sealed environment 114 as described above could be provided in combination with other linear translation means described herein to facilitate precise movement control of the stub 134 when desired. For example, as described above, the linear translation means according to certain embodiments includes stepping coils configured to extend radially around the exterior of the pocket 132 such that the stub 134 rotates as it linearly translates into and out from the internal space 130. According to this embodiment, a threaded rod could extend from the distal surface 148 of pocket 132 to facilitate and support the rotation of stub 134.

The foregoing description of embodiments for this disclosure has been presented for purposes of illustration and description. It is not intended to be exhaustive or to limit the disclosure to the precise form disclosed. Obvious modifications or variations are possible in light of the above teachings. The embodiments are chosen and described in an effort to provide illustrations of the principles of the disclosure and its practical application, and to thereby enable one of ordinary skill in the art to utilize the disclosure in various embodiments and with various modifications as are suited to the particular use contemplated. All such modifications and variations are within the scope of the disclosure as determined by the appended claims when interpreted in accordance with the breadth to which they are fairly, legally, and equitably entitled.

What is claimed is:

1. A stub tuner apparatus comprising:
a body portion having a first end and a second end and defining an internal space configured to carry electromagnetic energy, the body portion operable to form a portion of a gas-sealed environment;
a gas-sealed pocket extending from the body portion such that, when the body portion forms the portion of the gas-sealed environment, the stub tuner apparatus is gas sealed;
a stub disposed in the gas-sealed pocket; and
linear translation means for moving the stub at least partially out from and into the pocket and at least partially into and out from the internal space without breaching the gas-sealed environment of the stub tuner apparatus.

2. The stub tuner of claim 1 wherein the first end includes a gas sealing member and the second end includes a downstream opening configured for connecting to a processing chamber.

3. The apparatus of claim 1 wherein the gas-sealed pocket includes one or more retractable walls that are movable between a collapsed position wherein the stub disposed in the gas-sealed pocket is moved towards the internal space of the body portion and an extended position wherein the stub disposed in the gas-sealed pocket is moved away from the internal space, the linear translation means including an actuator disposed outside the gas-sealed pocket for causing movement of the one or more retractable walls.

4. The apparatus of claim 1 wherein the linear translation means comprises:

a first magnetic member disposed inside the pocket and coupled to the stub such that the stub is movable with the first magnetic member; and a second magnetic member disposed outside the pocket and configured to magnetically couple with the first magnetic member such that the first magnetic member is movable with the second magnetic member.

5. The apparatus of claim 1 wherein the linear translation means comprises:

a first magnetic member disposed inside the pocket and coupled to the stub such that the stub is movable with the first magnetic member; and a plurality of stepping coils disposed exterior to and along the length of the pocket and wherein the stub is moved along the length of the pocket by sequentially activating and deactivating the stepping coils in the direction that the stub is to be moved.

6. The apparatus of claim 5 wherein the plurality of stepping coils are configured to radially extend around the exterior of the pocket such that the stub rotates as it is moved along the length of the pocket.

7. The apparatus of claim 1 wherein the pocket is dimensioned and configured such that the stub falls out of the internal space and into the pocket when the linear translation means is deactivated.

8. The apparatus of claim 1 further comprising a channel dimensioned and configured to allow gas pressure in the pocket below a distal surface of the stub to be equalized with gas pressure located above a proximal surface of the stub.

9. A microwave processing system comprising:
a microwave source for generating microwaves;
a processing chamber in communication with the microwave source; and
a stub tuner disposed between the microwave source and the processing chamber, the processing chamber and the stub tuner forming a gas-sealed environment, the stub tuner including a body portion defining an internal space, a gas-sealed pocket extending from the body portion, a stub disposed in the gas-sealed pocket, and linear translation means for moving the stub at least partially out from and into the pocket and at least partially into and out from the internal space without breaching the gas-sealed environment.

10. The microwave processing system of claim 9 further comprising a wave guide for guiding the microwaves from the microwave source to the processing chamber and a gas-sealing member separating the wave guide into a first portion and a second portion, the gas-sealing member configured to permit microwaves to travel from the first portion to the second portion of the wave guide and to prevent gas from traveling between the first and second portion of the wave guide, the stub tuner disposed downstream from the gas-sealing member.

11. The microwave processing system of claim 10 wherein the stub tuner forms the second portion of the wave guide.

12. The microwave processing system of claim 9 further comprising a gas supply for selectively supplying gas to the gas-sealed environment and a gas outlet for selectively exhausting gas from the gas-sealed environment, wherein one of a pressurized and vacuum atmosphere is formed within the gas-sealed environment by selectively supplying or exhausting gas from the gas-sealed environment.

13. The microwave processing system of claim 9 further comprising a wave matching feature disposed within the first portion of the wave guide for matching the impedance of the microwaves generated by the microwave source to the impedance of the gas-sealing member.

14. The microwave processing system of claim 9 wherein the gas-sealed pocket of the stub tuner includes one or more retractable walls that are movable between a collapsed position wherein the stub disposed in the gas-sealed pocket is moved towards the internal space of the body portion and an extended position wherein the stub disposed in the gas-sealed pocket is moved away from the internal space, the linear translation means including an actuator disposed outside the gas-sealed pocket for causing movement of the one or more retractable walls.

15. The microwave processing system of claim 9 wherein the linear translation means comprises:

a first magnetic member disposed inside the pocket and coupled to the stub such that the stub is movable with the first magnetic member; and a second magnetic member disposed outside the pocket and configured to magnetically couple with the first magnetic member such that the first magnetic member is movable with the second magnetic member.

16. The microwave processing system of claim 9 wherein the linear translation means comprises:

a first magnetic member disposed inside the pocket and coupled to the stub such that the stub is movable with the first magnetic member; and a plurality of stepping coils disposed exterior to and along the length of the pocket and wherein the stub is moved along the length of the pocket by sequentially activating and deactivating the stepping coils in the direction that the stub is to be moved.

17. The microwave processing system of claim 16 wherein the plurality of stepping coils are configured to radially extend around the exterior of the pocket such that the stub rotates as it is moved along the length of the pocket.

18. The microwave processing system of claim 9 wherein the pocket is dimensioned and configured such that the stub falls out of the internal space and into the pocket when the linear translation means is deactivated.

19. The microwave processing system of claim 9 further comprising a channel dimensioned and configured to allow gas pressure in the pocket below a distal surface of the stub to be equalized with gas pressure located above a proximal surface of the stub.

20. A method of tuning a microwave system comprising:
providing a microwave source for generating microwaves and a processing chamber for housing an intended load;
providing a waveguide for guiding microwaves from the microwave source to the intended load in the processing chamber;
positioning a stub tuner between the microwave source and the processing chamber, the processing chamber and the stub tuner forming a gas-sealed environment, the stub tuner including a body portion defining an internal space, a gas-sealed pocket extending from the body portion, and a stub linearly translatable within the gas-sealed pocket;
generating microwaves using the microwave source and causing the microwaves to travel through the waveguide and internal space of the stub tuner to the processing chamber; and
moving the stub at least partially out from and into the gas-sealed pocket and at least partially into and out from the internal space of the body portion of the stub tuner without breaching the gas-sealed environment to modify an impedance of the intended load.

21. The method of claim 20 further comprising providing a wave guide for guiding the microwaves from the microwave source to the processing chamber and a gas-sealing member separating the wave guide into a first portion and a second portion, the gas-sealing member configured to permit microwaves to travel from the first portion to the second portion of the wave guide and to prevent gas from traveling between the first and second portion of the wave guide, the stub tuner disposed downstream from the gas-sealing member.

22. The method of claim 21 wherein the stub tuner forms the second portion of the wave guide.

\* \* \* \* \*